United States Patent [19]
Sorrells et al.

[11] Patent Number: 5,252,867
[45] Date of Patent: Oct. 12, 1993

[54] SELF-COMPENSATING DIGITAL DELAY SEMICONDUCTOR DEVICE WITH SELECTABLE OUTPUT DELAYS AND METHOD THEREFOR

[75] Inventors: Peter H. Sorrells, Chandler; Ned D. Garinger, Tempe, both of Ariz.

[73] Assignee: VLSI Technology, Inc., San Jose, Calif.

[21] Appl. No.: 843,488

[22] Filed: Feb. 28, 1992

Related U.S. Application Data

[63] Continuation-in-part of Ser. No. 836,078, Feb. 14, 1992.

[51] Int. Cl.$^5$ ............................................. H03K 5/13
[52] U.S. Cl. ................................ 307/606; 378/55; 307/603
[58] Field of Search ............... 307/594, 597, 603, 605, 307/606, 480–481; 328/55, 56

[56] References Cited

U.S. PATENT DOCUMENTS

| | | | |
|---|---|---|---|
| 4,868,430 | 9/1989 | Stewart | 328/55 |
| 4,922,141 | 5/1990 | Lofgrew | 328/55 |
| 4,965,815 | 10/1990 | Boudewijns | 328/55 |
| 5,087,842 | 2/1992 | Pulphiser | 307/606 |
| 5,111,086 | 5/1992 | Back | 328/55 |

Primary Examiner—Edward P. Westin
Assistant Examiner—Andrew Sanders
Attorney, Agent, or Firm—Harry M. Weiss

[57] ABSTRACT

A self-compensated digital delay semiconductor device is disclosed which uses two identical chains of delay elements. The first chain is the Reference Chain, which is driven by a crystal-controlled digital clock input. The second chain is the Input Signal Delay Chain, which is the delay path for the signal of interest. These two chains are located in physical proximity on the semiconductor die so that variations in manufacturing process, temperature and power supply affect each chain the same. Each of these delay chains is comprised of a series of variable delay elements which are digitally controlled by Monitor Logic, which measures the delay performance of the Reference Chain, and dynamically adjusts the delay of the variable delay elements as induced variations are induced, thereby compensating the delay of the device. Any one of these precise delays can be routed to the output by driving a tap select multiplexer to select the delay of interest. This approach provides precise delays which are constant within a tight tolerance.

3 Claims, 1 Drawing Sheet

SELF-COMPENSATING DIGITAL DELAY SEMICONDUCTOR DEVICE WITH SELECTABLE OUTPUT DELAYS AND METHOD THEREFOR

RELATED APPLICATION

This patent application is a continuation-in-part of our earlier parent patent application entitled "COMPENSATED DIGITAL DELAY SEMICONDUCTOR DEVICE WITH SELECTABLE OUTPUT TAPS AND METHOD THEREFOR", U.S. Ser. No. 07/836,078; filed Feb. 14, 1992, and in the same inventor names as the inventors of this patent application and the parent patent application is incorporated herein by reference thereto.

FIELD OF THE INVENTION

This invention generally relates to semiconductor devices and methods, and, more specifically, relates to a digital delay semiconductor device with selectable output delays and method therefor which provides several precise delays of the digital input signal, any one of which can be selected by asserting the appropriate control inputs to the tap enable multiplexer, which routes the desired delay to the output. This device and method includes self-compensation to correct for variations in manufacturing process, temperature and power supply variations such that the delay from digital input signal to the selected tap remains constant within a relatively tight tolerance.

DESCRIPTION OF THE PRIOR ART

The prior art provided various types of digital delay semiconductor devices and methods for providing the needed delays to satisfy timing parameters in a digital electronic system. One example of a system that requires specific delays is the refresh circuitry for Dynamic Random Access Memory (DRAM) devices. The problem with the prior art devices is that the delay from input to output varied considerably with variations in manufacturing process, operating temperature and power supply voltage. This problem was generally solved by designing the system architecture to eliminate the need for precise and constant delays, which generally resulted in a reduction of performance and flexibility of the system.

Therefore, there existed a need to provide a digital delay semiconductor device and method with selectable output delays which is self-compensated such that the each output delay is held relatively constant with respect to variations in manufacturing process, temperature and power supply voltage.

SUMMARY OF THE INVENTION

It is an object of this invention to provide an improved digital delay semiconductor device with selectable output delays and method therefor which provides a plurality of output delays with respect to a digital input signal, any one of which can be selected and routed to the output with a tap enable multiplexer.

It is another object of this invention to provide an improved digital delay semiconductor device with selectable output delays and method therefor which includes self-compensation for holding the output delays relatively constant with respect to variations in the manufacturing process, temperature and power supply voltage.

It is a further object of this invention to provide an improved self-compensated digital delay semiconductor device with selectable output delays and method therefor which uses a compensation scheme that changes the configuration of the device in real-time to assure relatively constant output delays with respect to variations in the manufacturing process, temperature and power supply voltage.

According to the present invention, a digital delay semiconductor device and method therefor is provided. This device has two parallel chains of delay elements that are adjacent on the semiconductor die such that effects induced by variations in the manufacturing process, temperature and power supply voltage will affect both chains of delay elements in the same manner. Both of these chains are comprised of a series of variable delay elements.

Each of these variable delay elements has N delay elements in parallel, each having a separate enable. Each of the N delay elements provides a different delay in binary multiples of the lowest delay element. Variations (step changes) in delay are achieved by varying the drive capability of each element. Delay is inversely proportional to drive capability. In other words, the first delay element has drive capability of X, the second delay element has a drive capability of 2X, the third delay element has a drive capability of 4X, and the Nth delay element has a drive capability of $2^{(N-1)}X$. Since the four delay elements have individual enable lines, any binary combination of delay from X (all drivers ON) to $(2^N-1)X$ (only the 1X drive ON) can be selected, depending on the Control Word driving the N enable lines. The enable lines to the variable delay elements are connected in parallel such that each variable delay element will have the same combination on the enable lines, resulting in substantially similar delays from one variable delay element to the next.

The first of the two parallel chains of variable delay elements is a Reference Chain which has a crystal-controlled digital clock signal as the input, known as the Crystal Oscillator. The output of this Reference Chain is connected to Monitor Logic, which compares the output of the Reference Chain to the Crystal Oscillator signal, and drives the Control Word to the chain of variable delay elements to adjust the delay of the chain accordingly. The length of the Reference Chain is such that the nominal delay from input to output is one full clock cycle of the Crystal Oscillator. The Monitor Logic compares the output edge of the Reference Chain to the output edge of the Crystal Oscillator to determine which occurs first. If the edge of the Crystal Oscillator arrives first, the Monitor Logic will configure a new Control Word to the variable delay elements which will cause a step decrease in the unit delay of each variable delay element. If the output edge of the Reference Chain arrives first, the Monitor Logic will configure a new Control Word which causes a step increase in the unit delay of each variable delay element. The Monitor Logic performs these functions each clock cycle until the edge of the Crystal Oscillator and the output edge of the Reference Chain are coincident within a user-defined tolerance. Hysteresis is designed into the Monitor Logic to stabilize the control word once coincidence is established.

The second chain of variable delay elements is the Signal Delay Chain. This Signal Delay Chain has an identical configuration to the Reference Chain and is located in physical proximity to the Reference Chain on the semiconductor die. In addition, the variable delay elements of the Signal Delay Chain are driven by the same Control Word from the Monitor Logic. In this manner the Monitor Logic dynamically adjusts the delay of both chains simultaneously. This adjustment mechanism keeps the delay from signal input to the signal outputs of the Input Signal Delay Chain relatively constant over induced variations. The device self-compensates with each clock cycle of the Crystal Oscillator, which is several orders of magnitude faster than any induced variations.

The foregoing and other objects, features and advantages will be apparent from the following description of the preferred embodiment of the invention as illustrated in the accompanying drawings.

DESCRIPTION OF THE PREFERRED EMBODIMENT

Figure 1:
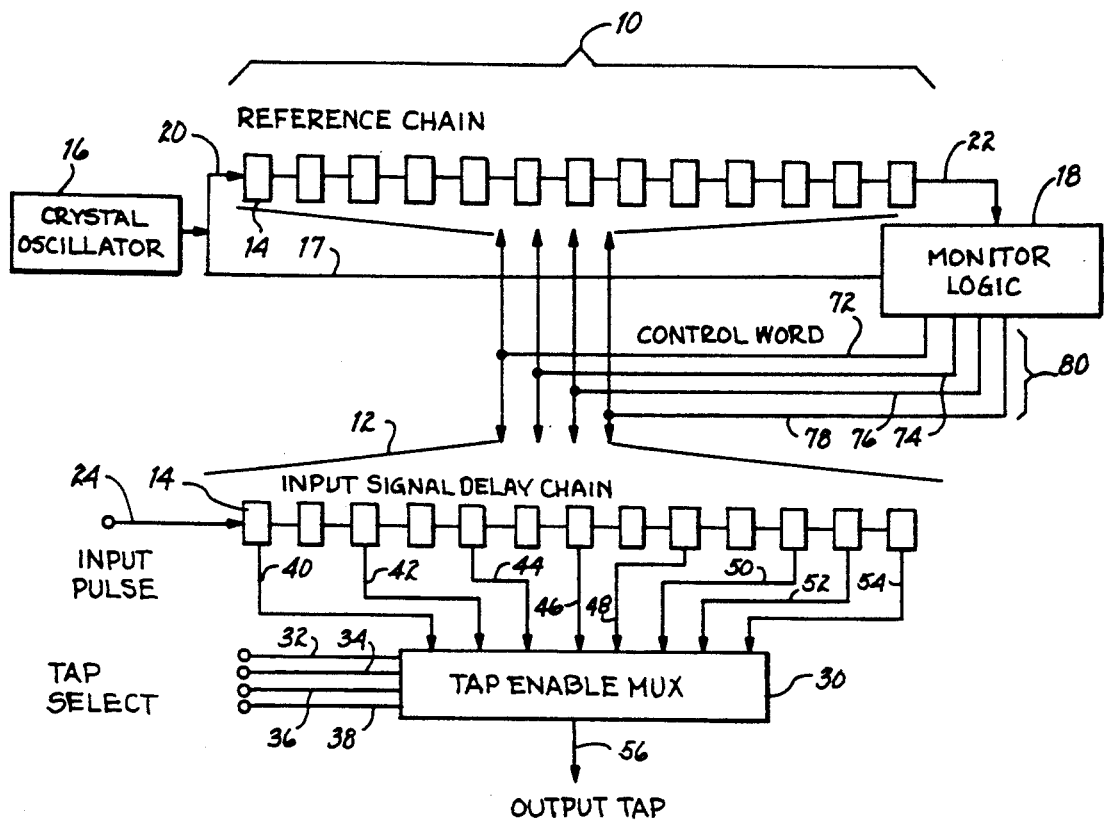
FIG. 1 is a block diagram of the self-compensated digital delay semiconductor device with selectable output delays of the present invention.

Referring to FIG. 1, two identical chains of delay elements are provided, a Reference Chain 10 and an Input Signal Delay Chain 12. The Reference Chain 10 and the Input Signal Delay Chain 12 are located adjacent to each other on the semiconductor die such that variations in the manufacturing process, temperature or power supply voltage will affect both chains in the same manner. Each of these chains is comprised of a series of identical variable delay elements 14, with the output of each stage driving the input of the next stage. The configuration of the variable delay element 14 used in Reference Chain 10 and Input Signal Delay Chain 12 is shown in FIG. 2.

Figure 2:
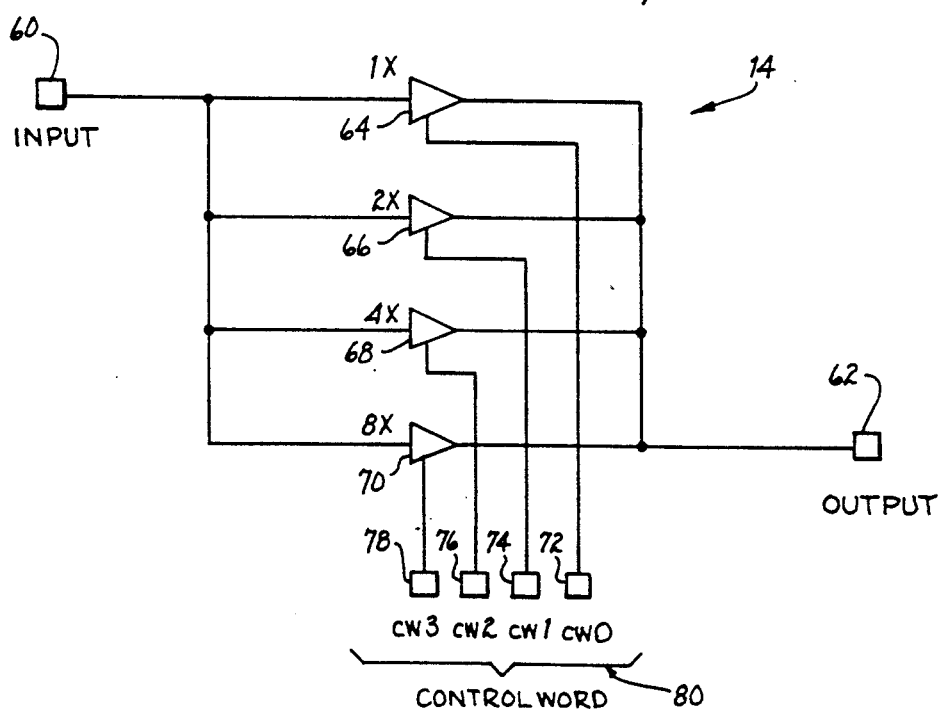
FIG. 2 is a block diagram of the digitally-controlled variable delay element used in the Reference Chain and the Signal Delay Chain of FIG. 1.

The variable delay element 14 of FIG. 2 has an input 60, an output 62, and four delay elements 64, 66, 68 and 70 as shown, each having a respective enable line 72, 74, 76 and 78. Variations (step changes) in delay are achieved by varying the drive capability of each element. Delay is inversely proportional to drive capability. Delay element 64 has a drive capability of X, delay element 66 has a drive capability of 2X, delay element 68 has a drive capability of 4X, and delay element 70 has a drive capability of 8X. The drive capability X represents the nominal drive capability of one driver, and the increased drive capability of elements 66, 68, and 70 are provided by simply placing the appropriate number of drivers in parallel, thereby increasing the drive capability, thereby reducing the delay. Each delay element 64, 66, 68 and 70 can be individually enabled with the Control Word 80, which drives enable lines 72, 74, 76 and 78. Since the delay values of elements 64, 66, 68 and 70 are in binary multiples, any delay from X (all drives ON) to 15X (only the 1X driver ON) can be digitally selected by driving the appropriate Control Word 80 on enable lines 72, 74, 76 and 78, as shown in FIGS. 1 and 2.

Referring again to FIG. 1, Reference Chain 10 has a Crystal Oscillator 16 that provides the stable reference input signal 17 to Reference Chain 10 and to the Monitor Logic 18. Since this Crystal Oscillator 16 is crystal-controlled, the input frequency will not change with normal variations of temperature and power supply voltage. The length of the Reference Chain 10 is such that the nominal delay from input 20 to output 22 is nominally the same as one period of the Crystal Oscillator 16. The function of the Monitor Logic 18 is to compare the edge of the Crystal Oscillator signal 17 to the edge of the Reference Chain Output 22, and adjust the Control Word 80 to increase or decrease the delay through the Reference Chain 10 until the two edges are coincident within a user-defined tolerance.

For example, if the edge of the Crystal Oscillator Output 17 arrives before the edge of the Reference Chain Output 22, the Monitor Logic configures a new Control Word 80 which causes a step decrease in the unit delay of each variable delay element 14. If the edge of the Crystal Oscillator Output 17 arrives after the edge of the Reference Chain Output 22, the Monitor Logic configures a new Control Word 80 which causes a step increase in the unit delay of each variable delay element 14. This adjustment continues each clock period until the two edges are coincident within the selected tolerance. Built-in hysteresis in the Monitor Logic 18 assures that the Control Word 80 is held stable until an induced variation changes the delay characteristics of the Reference Chain 10.

Input Signal Delay Chain 12 has a configuration identical to Reference Chain 10, and the variable delay elements 14 of both chains are driven by the same Control Word 80. In this manner any induced variations detected in Reference Chain 10 modify Input Signal Delay Chain 12 such that the delay from input 24 to the respective outputs 40, 42, 44, 46, 48, 50, 52 and 54 are held constant within a tight tolerance.

The device has a tap enable multiplexer 30 that is used to select one of the outputs 40, 42, 44, 46, 48, 50, 52 and 54 to be outputed to the Output Tap 56. The appropriate output is selected depending on the state of the tap select lines 32, 34, 36 and 38. This tap enable multiplexer 30 allows the delay from input 24 to output 56 to be changed dynamically by changing the tap select lines 32, 34 36 and 38.

The configuration of the delay device of the present invention lends itself to modification for added versatility. For example, one Crystal Oscillator 16 and one Reference Chain 10 could be the means of compensating several Input Signal Delay Chains 12 all at the same time, thereby providing multiple inputs driving different outputs that are all held constant within a tight tolerance. In the alternative, multiple Input Signal Delay Chains 12 could be connected in series to provide for longer delays than would otherwise be possible. These different configurations are possible by placing all Input Signal Delay Chains 12 in close proximity to the Reference Chain 10 on the semiconductor die, and having one Control Word 80 from Monitor Logic 18 control all of the variable delay elements 14 of the Input Signal Delay Chains 12 at the same time.

While the invention has been described in its preferred embodiment, it is to be understood that the words which have been used are words of description rather than limitation, and that changes may be made within the purview of the appended claims without departing from the true scope and spirit of the invention in its broader aspects. For example, the number of outputs of the Input Signal Delay Chain 12 may be more or less than those shown, and the tap enable multiplexer 30 may be of varying size to accommodate few or many of the available outputs of Input Signal Delay Chain 12.

We claim:

1. A self-compensated digital delay semiconductor device comprising, in combination:

a first delay chain having a plurality of delay element means each of which is for providing a digitally-selectable delay from input to output, said delay element means being configured with said output of each of said plurality of delay element means connected to said input of the successive delay element means in serial fashion;

crystal-controlled oscillator means for providing an oscillating digital input to the first of said plurality of delay element means of said first delay chain, said oscillating digital input being substantially a square wave in shape;

a monitor logic unit having a plurality of outputs comprising control words which are driven in response to the time a first digital signal edge arrives at a first input of said monitor logic unit when compared to the time a second digital signal edge arrives at a second input of said monitor logic unit, said first input being electrically coupled to the output of said first delay chain, and said second input being electrically coupled to said oscillating digital input of said crystal-controlled oscillator means;

a second delay chain having a configuration of a plurality of delay element means each of which is for providing a digitally-selectable delay from input to output and each of which is identical in number to each of said plurality of delay element means of said first delay chain, having an input coupled to the digital signal to be delayed, and physically located adjacent to said first delay chain on a semiconductor die such that variations will affect said first delay chain and said second delay chain in the same manner;

said plurality of delay element means of said first delay chain and said plurality of delay element means of said second delay chain each having a digitally-selectable delay from said input to said output provided by driving said control words of said monitor logic unit to a plurality of inputs comprising delay control inputs on each of said plurality of delay element means; and tap enable multiplexer means coupled to a plurality of the outputs of said plurality of delay element means in said second delay chain, having output taps and a plurality of tap select lines for selecting one of said outputs of said plurality of delay element means in said second delay chain to be electrically coupled to said output taps, said plurality of tap select lines being input lines to said tap enable multiplexer means.

2. A method for providing a self-compensated digital delay semiconductor device comprising the steps of:

providing a first delay chain having a plurality of delay element means each of which is for providing a digitally-selectable delay from input to output, said delay element means being configured with said output of each of said plurality of delay element means connected to said input of the successive delay element means in serial fashion;

providing crystal-controlled oscillator means for providing an oscillating digital input to the first of said plurality of delay element means of said first delay chain, said oscillating digital input being substantially a square wave in shape;

providing a monitor logic unit having a plurality of outputs comprising control words which are driven in response to the time a first digital signal edge arrives at a first input of said monitor logic unit when compared to the time a second digital signal edge arrives at a second input of said monitor logic unit, said first input being electrically coupled to the output of said first delay chain, and said second input being electrically coupled to said oscillating digital input of said crystal-controlled oscillator means;

providing a second delay chain having a configuration of a plurality of delay element means each of which is for providing a digitally-selectable delay from input to output and each of which is identical in number to each of said plurality of delay element means of said first delay chain means, having an input coupled to the digital signal to be delayed, and physically located adjacent to said first delay chain on the semiconductor die such that variations will affect said first delay chain and said second delay chain in the same manner;

said plurality of delay element means of said first delay chain and said plurality of delay element means of said second delay chain each having a digitally-selectable delay from said input to said output provided by driving said control words of said monitor logic unit to a plurality of inputs comprising delay control inputs on each of said plurality of delay element means; and providing tap enable multiplexer means coupled to a plurality of the outputs of said plurality of delay element means in said second delay chain, having output taps and a plurality of tap select lines for selecting one of said outputs of said plurality of delay element means in said second delay chain to be electrically coupled to said output taps, said plurality of tap select lines being input lines to said tap enable multiplexer means.

3. The method of claim 2 further providing the step of:

providing input edge detection means within said monitor logic unit that compares the input edge of said first input in relation to the input edge of said second input within a defined tolerance, and configures said control words to provide a step decrease in said control words when said input edge of said first input arrives after said input edge of said second input, and configures said control words to provide a step increase in said control words when said input edge of said first input arrives before said input edge of said second input, and maintains the current configuration of said control words when said input edge of said first input arrives at the same time as said input edge of said second input within said defined tolerance.

* * * * *